(12) United States Patent
Kadoguchi et al.

(10) Patent No.: US 8,994,167 B2
(45) Date of Patent: Mar. 31, 2015

(54) SEMICONDUCTOR DEVICE

(71) Applicants: Takuya Kadoguchi, Toyota (JP); Shingo Iwasaki, Toyota (JP); Tomohiro Miyazaki, Seto (JP); Masayoshi Nishihata, Chiryu (JP); Tomomi Okumura, Anjo (JP)

(72) Inventors: Takuya Kadoguchi, Toyota (JP); Shingo Iwasaki, Toyota (JP); Tomohiro Miyazaki, Seto (JP); Masayoshi Nishihata, Chiryu (JP); Tomomi Okumura, Anjo (JP)

(73) Assignees: Toyota Jidosha Kabushiki Kaisha, Toyota-Shi (JP); Denso Corporation, Kariya-Shi (JP)

( * ) Notice: Subject to any disclaimer, the term of this patent is extended or adjusted under 35 U.S.C. 154(b) by 0 days.

(21) Appl. No.: 14/368,628

(22) PCT Filed: Dec. 21, 2012

(86) PCT No.: PCT/IB2012/002777
§ 371 (c)(1),
(2) Date: Jun. 25, 2014

(87) PCT Pub. No.: WO2013/098629
PCT Pub. Date: Jul. 4, 2013

(65) Prior Publication Data
US 2014/0374895 A1 Dec. 25, 2014

(30) Foreign Application Priority Data

Dec. 26, 2011 (JP) .................................. 2011-282920

(51) Int. Cl.
*H01L 29/72* (2006.01)
*H01L 23/367* (2006.01)
*H01L 23/31* (2006.01)

(52) U.S. Cl.
CPC ........ *H01L 23/3672* (2013.01); *H01L 23/3142* (2013.01)
USPC ............................ 257/707; 257/713; 257/796

(58) Field of Classification Search
USPC .......................................... 257/707, 713, 796
See application file for complete search history.

(56) References Cited

U.S. PATENT DOCUMENTS

| 5,229,918 A | * | 7/1993 | Della Bosca et al. | 361/710 |
| 2004/0159962 A1 | * | 8/2004 | Ishiyama | 257/787 |
| 2007/0057357 A1 | * | 3/2007 | Chen | 257/686 |

FOREIGN PATENT DOCUMENTS

| EP | 0497744 | * | 5/1992 |
| EP | 0497744 A1 | | 8/1992 |
| JP | 2003-124406 A | | 4/2003 |
| JP | 2003124406 | * | 4/2003 |
| WO | 2013/046400 A1 | | 4/2013 |

OTHER PUBLICATIONS

Naohiko Hirano, et al., "Structural Structural Development of Double-sided Cooling Power Modules," DENSO Technical Review vol. 16, 2011, pp. 30-37, with English abstract.

* cited by examiner

*Primary Examiner* — Edward Wojciechowicz
(74) *Attorney, Agent, or Firm* — Kenyon & Kenyon LLP

(57) ABSTRACT

A semiconductor device includes a plurality of semiconductor elements each having a front surface and a back surface; a front surface-side heatsink that is positioned on a front-surface side of the semiconductor elements and dissipates heat generated by the semiconductor elements; a back surface-side heatsink that is positioned on a back surface-side of the semiconductor elements and dissipates heat generated by the semiconductor elements; a sealing material that covers the semiconductor device except for a front surface of the front surface-side heatsink and a back surface of the back surface-side heatsink; a primer that is coated on at least one of the front surface-side heatsink and the back surface-side heatsink and improves contact with the sealing member; and a protruding portion positioned between the plurality of semiconductor elements, on at least one of the back surface of the front surface-side heatsink and the front surface of the back surface-side heatsink.

6 Claims, 5 Drawing Sheets

SEMICONDUCTOR DEVICE

CROSS-REFERENCE TO RELATED APPLICATIONS

This is a national phase application based on the PCT International Patent Application No. PCT/IB2012/002777 filed Dec. 21, 2012, claiming priority to Japanese patent application No. 2011-282920 filed Dec. 26, 2011, the entire contents of both of which are incorporated herein by reference.

BACKGROUND OF THE INVENTION

1. Field of the Invention

The invention relates to a semiconductor device that may be applied to a vehicle such as a passenger vehicle, a truck, or a bus, and a household appliance or an industrial appliance, for example.

2. Description of the Related Art

In a semiconductor device with a mounted switching element such as an IGBT (Insulated Gate Bipolar Transistor) or an IPM (Intelligent Power Module), i.e., a semiconductor element, the semiconductor element is a heat generating component that needs to be effectively cooled.

Japanese Patent Application Publication No. 2003-124406 (JP 2003-124406 A), for example, describes technology for suitably cooling a semiconductor element that is one such heat generating component, using a heatsink such as a heat spreader on a front surface side and a back surface side of the semiconductor element. After the semiconductor element and the pair of heatsinks on the front surface side and the back surface side have been combined, they are molded with a thermosetting resin so as to form a module, i.e., a semiconductor device.

A difference in thermal expansion coefficients is large between the resin, and the heatsinks and semiconductor element, which may result in peeling occurring between the mold resin and the heatsinks following cure shrinkage during molding. In the related art, a primer is applied to the contact areas of the heatsinks and the mold resin, i.e., sealing member, to inhibit peeling from occurring. However, when molding a plurality of semiconductor elements, in particular, primer of an appropriate thickness is unable to be applied between the semiconductor elements, so it is difficult appropriately inhibit peeling.

SUMMARY OF THE INVENTION

The invention provides a semiconductor device that appropriately inhibits peeling from occurring between a heatsink and sealing member.

A first aspect of the invention relates to a semiconductor device that includes a plurality of semiconductor elements each having a front surface and a back surface; a front surface-side heatsink that is positioned on a front surface side of the semiconductor elements and dissipates heat generated by the semiconductor elements; a back surface-side heatsink that is positioned on a back surface side of the semiconductor elements and dissipates heat generated by the semiconductor elements; a sealing material that covers the semiconductor device except for a front surface of the front surface-side heatsink and a back surface of the back surface-side heatsink; a primer that is coated on at least one of the front surface-side heatsink and the back surface-side heatsink and improves contact with the sealing member; and a protruding portion positioned between the plurality of semiconductor elements, on at least one of the back surface of the front surface-side heatsink and the front surface of the back surface-side heatsink.

In the aspect described above, the semiconductor device may also include a recessed portion provided in a position corresponding to the protruding portion, on at least one of the front surface of the front surface-side heatsink and the back surface of the back surface-side heatsink. Also, a height of the protruding-portion may be lower than a height of the recessed portion, and the protruding portion may extend in a perpendicular direction that is perpendicular to an arranging direction in which the plurality of semiconductor elements is arranged.

In the aspect described above, the protruding portion may extend intermittently in the perpendicular direction, the protruding portion may exist in plurality in the perpendicular direction, an end in the perpendicular direction of the protruding portion may be aligned with end portions of at least one of the front surface-side heatsink and the back surface-side heatsink, and an end in the perpendicular direction of the protruding portion may be located in a region where the semiconductor elements exist laterally in the perpendicular direction.

According to the aspect described above, the front surface-side heatsink and the back surface-side heatsink that are positioned between semiconductor elements are able to ensure that the film thickness of the primer positioned between the sealing material, and the front surface-side heatsink and the back surface-side heatsink is an appropriate value, by the protruding portion. Therefore, the joining ability between the sealing member, and the front surface-side heatsink and the back, surface-side heatsink is able to be increased, so peeling at the boundary surface between the back surface side of the front surface-side heatsink and the front surface side of the sealing material, and between the front surface side of the back surface-side heatsink and the back surface side of the sealing material is able to be inhibited from occurring.

BRIEF DESCRIPTION OF THE DRAWINGS

The features, advantages, and technical and industrial significance of this invention will be described in the following detailed description of example embodiments of the invention with reference to the accompanying drawings, in which like numerals denote like elements, and wherein.

DETAILED DESCRIPTION OF EMBODIMENTS

Hereinafter, example embodiments of the invention will be described with reference to the accompanying drawings.

Figure 1:
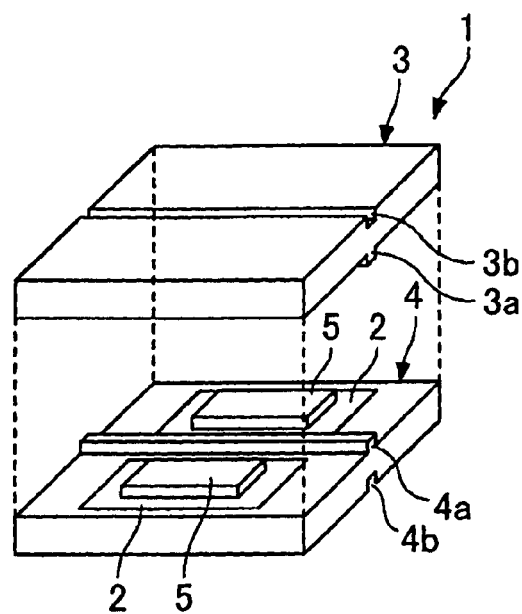
FIG. 1 is a view showing a frame format of an exterior of a semiconductor device according to a first example embodiment of the invention, as viewed diagonally from above at an angle.

FIG. 1 is a view of a semiconductor device 1 according to a first example embodiment of the invention. This semiconductor device 1 includes two semiconductor elements 2, each of which is flat and quadrilateral-shaped and has a front surface and a back surface, a heat spreader 3 (a front surface-side heatsink) that is positioned on the front surface side of the two semiconductor elements 2 and dissipates the heat generated by the semiconductor elements 2, and a heat spreader 4 (a back surface-side heatsink) that is positioned on the back surface side of the two semiconductor elements 2 and dissipates the heat generated by the semiconductor elements 2. The semiconductor device 1 also has protruding portions 3a and 4a positioned between the two semiconductor elements 2, on the back surface of the heat spreader 3 and the front surface of the heat spreader 4.

Furthermore, with the semiconductor device 1 of the first example embodiment, the front surface of the heat spreader 3 and the back surface of the heat spreader 4 each has a recessed portion 3b and 4b corresponding to the protruding portion 3a and 4a, respectively. The protruding portions 3a and 4a and the recessed portions 3b and 4b extend along in a perpendicular direction that perpendicular to the direction in which the two semiconductor elements 2 are arranged. In the example in FIG. 1, the ends in the perpendicular direction of the protruding portions 3a and 4a and the recessed portions 3b and 4b are aligned each other with the end portions of the heat spreader 3 and the heat spreader 4.

Figure 2:
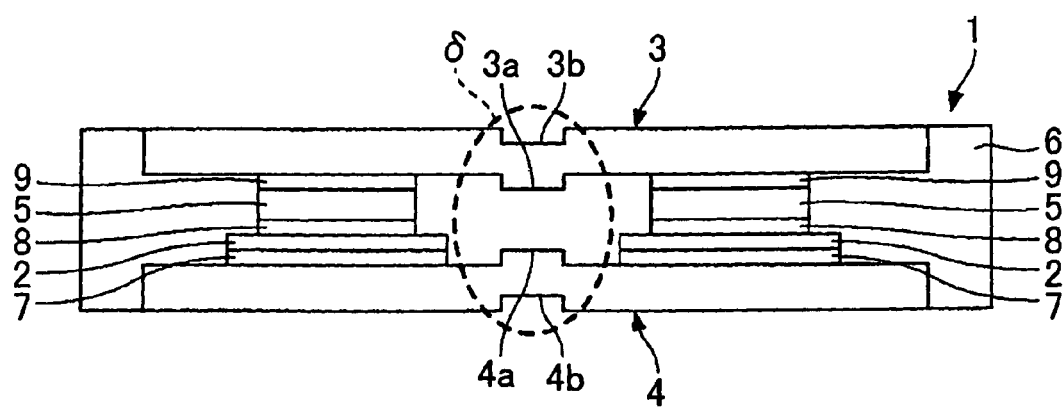
FIG. 2 is a view showing a frame format of modes of protruding portions and recessed portions and a stacked structure of the semiconductor device according to the first example embodiment of the invention, at a cross section that includes semiconductor elements.

When viewed from above (i.e., the front surface side) in FIG. 1, the two semiconductor elements 2 described above are arranged in the longitudinal direction on the front surface side of the heat spreader 4. As shown in FIG. 1, spacers 5 that adjust a space between the front surface of the semiconductor elements 2 and the back surface of the heat spreader 3 are arranged on the front surface side of the semiconductor elements 2. FIG. 2 is a sectional view of the semiconductor device 1 in FIG. 1. As shown in FIG. 2, except for the front surface of the heat spreader 3 and the back surface of the heat spreader 4, the semiconductor device 1 is covered by sealing member 6.

The heat spreader 3 and the heat spreader 4 in the first example embodiment are formed by stamping out base material that is flat and has good thermal conductivity and electrical conductivity, such as copper or aluminum, in a rectangular shape, for example, by press forming, for example.

During this press forming, the recessed portion 3b of the heat spreader 3 and the recessed portion 4b of the heat spreader 4 are formed by pressing using a die-side protruding portion that has a rectangular shape, not shown. With the formation of the recessed portion 3b and the recessed portion 4b, the base material moves in the pressing direction such that the protruding portion 3a is formed on the side opposite the recessed portion 3b of the heat spreader 3, and the protruding portion 4a is formed on the side opposite the recessed portion 4b of the heat spreader 4.

Also, the spacers 5 are each also formed by stamping out base material of copper or the like, for example, that is flat and has good thermal conductivity and electrical conductivity, in a tetragonal shape that is smaller than the semiconductor elements 2, for example, by press forming, for example.

Next, the stacked structure of the semiconductor device 1 will be described in detail with reference to FIG. 2. As shown in FIG. 2, the heat spreader 4 is electrically and thermally connected to the semiconductor elements 2 via a lower solder layer 7. The semiconductor elements 2 are electrically and thermally connected to the spacers 5 via an upper solder layer 8. The spacers 5 are thermally connected to the heat spreader 3 via a third solder layer 9.

The lower solder layer 7, the upper solder layer 8, and the third solder layer 9 are each formed by heating plate-like or sheet-like solder (a heat joining process) before a process of molding by the sealing member 6 arranged between the semiconductor elements 2 and the heat spreader 4, between the spacers 5 and the semiconductor elements 2, and between the heat spreader 3 and the spacers 5.

Figure 3:
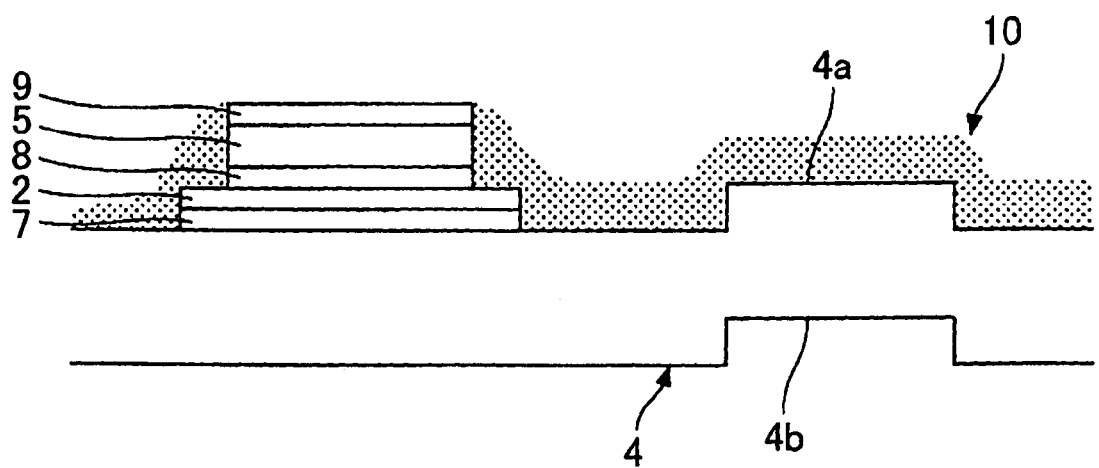
FIG. 3 is a view showing a frame format of the relationship between primer thickness and the protruding portions of the semiconductor device according to the first example embodiment of the invention.

With the semiconductor device 1 of the first example embodiment, after this heat joining process and before molding the semiconductor device 1, primer 10 is applied as shown in FIG. 3, to the portion that contacts and joins to the sealing member 6. The primer 10 improves the contact between the heat spreaders 3 and 4 and the sealing member 6. To simplify the drawing, in FIG. 3, the heat spreader 3 on the front surface side is omitted; only the film thickness of the primer 10 after application is shown enlarged.

Here, the manner in which stress is generated at a boundary surface of the sealing member 6, and the heat spreader 3 and the heat spreader 4 in an assumed structure of the first example embodiment will be described with reference to FIGS. 4A to 4D. FIGS. 4A to 4D are views of an assumed structure in which the protruding portions 3a and 4a and the recessed portions 3b and 4b have been removed from the semiconductor device 1 of the first example embodiment shown in FIG. 1.

Figure 4A:
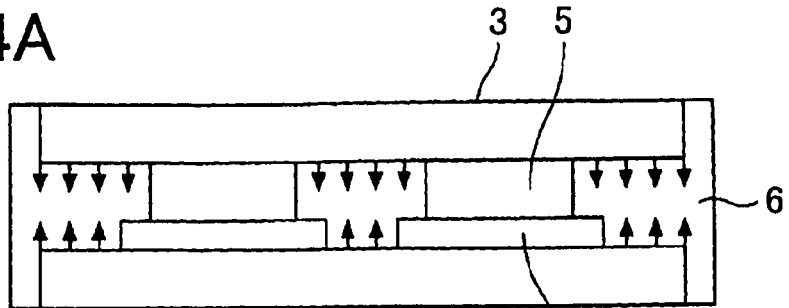
FIG. 4A is a view showing a frame format of the manner in which stress is generated in the sectional direction in an assumed structure of the semiconductor device according to the first example embodiment of the invention.

FIG. 4A is a view of a step of heat curing resin that forms the sealing member 6 after the resin has been filled into a gap between the heat spreader 3 and the heat spreader 4. In this step, as a curing reaction of the resin advances and the chemical cross-linking reaction progresses, the area decreases. As a result of this decrease in area, stress in the direction in which the joining surface peels acts, as indicated by the arrows in FIG. 4A, on the boundary surface between the resin and the back surface of the heat spreader 3, and the boundary surface between the resin and the front surface of the heat spreader 4.

Here, in the assumed structure shown in FIGS. 4A to 4D, when applying the primer 10 before filling the sealing member 6, the primer 10 will gravitate toward the semiconductor elements 2 side by the surface tension of the primer 10, so the primer 10 will not easily collect at the portion positioned between the two semiconductor elements 2, which makes it difficult to ensure the film thickness there.

Figure 4B:
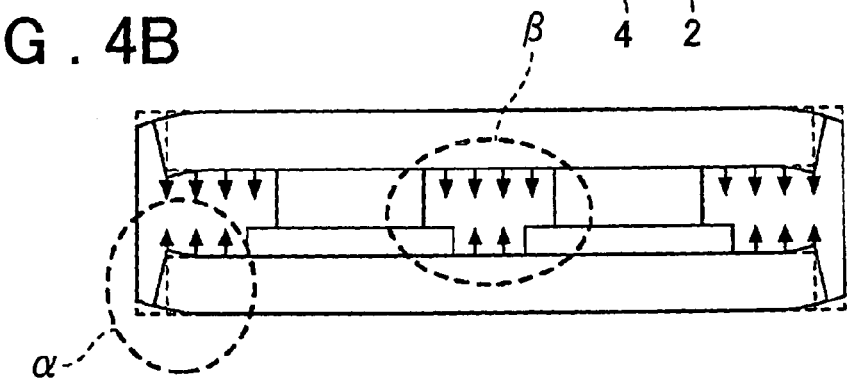
FIG. 4B is a view showing a frame format of deformation when stress is generated in the sectional direction in the assumed structure of the semiconductor device according to the first example embodiment of the invention.

Also, at a gap α positioned to the outside of the two semiconductor elements 2 in FIG. 4B, the heat spreader 3 and the heat spreader 4 both easily deform, so the heat spreader 3 and the heat spreader 4 both deform in a direction toward one another in the front-back direction as the resin shrinks. As a result, peeling is less apt to occur.

Figure 4C:
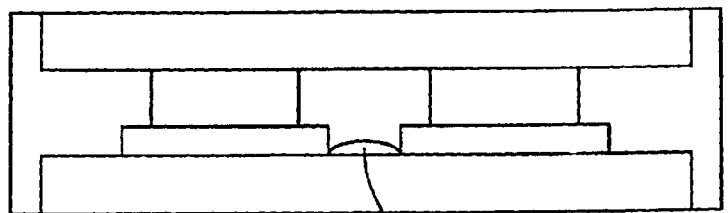
FIG. 4C is a view showing a frame format, as viewed from the side, of the manner in which peeling occurs in the assumed structure of the semiconductor device according to the first example embodiment of the invention.
Figure 4D:
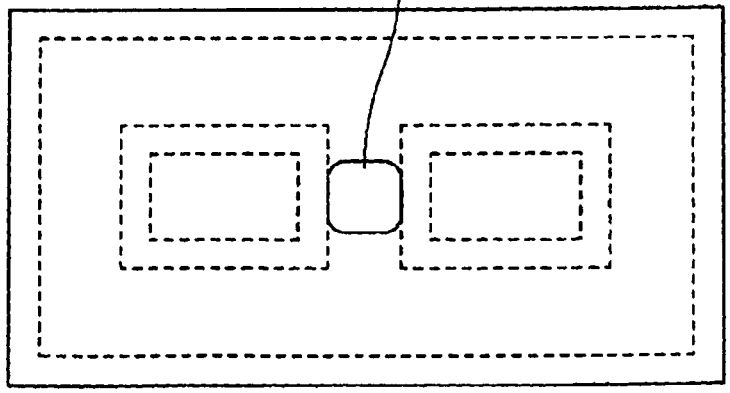
FIG. 4D is a view showing a frame format, as viewed from above, of the manner in which peeling occurs in the assumed structure of the semiconductor device according to the first example embodiment of the invention.

In contrast, at a gap β in FIG. 4B that is positioned to the inside of the two semiconductor elements 2, the heat spreaders 3 and 4 are supported by the pair of left and right semiconductor elements 2 and spacers 5, so neither of the heat spreaders 3 and 4 will easily deform. That is, at the gap β, neither the heat spreader 3 nor the heat spreader 4 deform in a direction toward one another as the resin shrinks, so if the film thickness of the primer 10 is insufficient, peeling γ as shown in FIGS. 4C and 4D may occur.

With the semiconductor device 1 of the first example embodiment, the protruding portions 3a and 4a are provided on the heat spreaders 3 and 4, respectively, as shown in FIG. 2, so the primer 10 is able to collect on the side with the protruding portions 3a and 4a using the surface tension of the primer 10. As a result, the primer 10 is able to be distributed evenly all the way in the left-right direction in FIG. 3, so the film thickness of the primer 10 can be appropriately ensured. Therefore, the joining ability of the heat spreaders 3 and 4 and the sealing member 6 is increased, so pealing is able to be inhibited from occurring.

Also in the semiconductor device 1 of the first example embodiment, the recessed portions 3b and 4b are provided on the heat spreaders 3 and 4, respectively, as shown in FIG. 2. As a result, the portion σ of the heat spreaders 3 and 4 that is positioned between the two semiconductor elements 2 in FIG. 2 is able to easily deform vertically. That is, even if the resin that makes up the sealing member 6 is compressed in a direction in which it separates from the heat spreaders 3 and 4 in the front-back direction due to heat curing, the portion a of the heat spreaders 3 and 4 will deform, so peeling will be inhibited.

Figure 5:
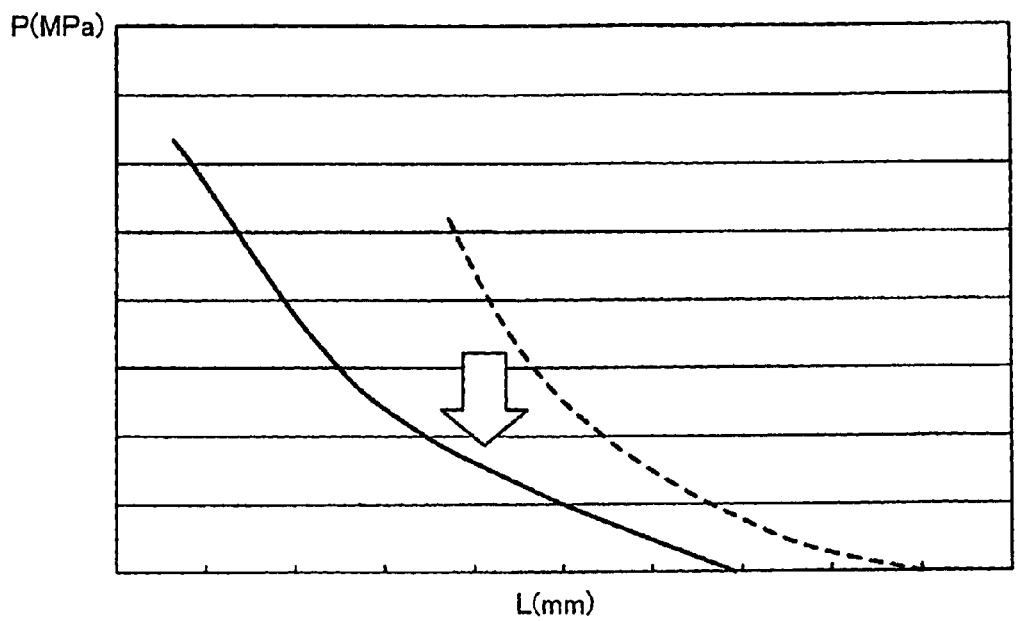
FIG. 5 is a view showing a frame format of a stress reducing effect in a planar direction of the semiconductor device according to the first example embodiment of the invention, based on a comparison with the assumed structure.

FIG. 5 is a graph showing the relationship between a distance L (mm) in the left-right direction in FIG. 2 of the two semiconductor elements 2, and stress P (MPa) at the boundary surface of the sealing material and the heat spreaders between the two semiconductor elements 2. In FIG. 5, the broken line represents the result of assumed technology (FIGS. 4A to 4D), and the solid line represents the result of the semiconductor device 1 of the first example embodiment. In FIG. 5, the distance L and the stress P illustrate an inversely proportional relationship, and the characteristic of the semiconductor device 1 of the first example embodiment is offset to the left of the characteristic of the assumed structure. This shows that when the pressures that inhibit peeling are comparable, the distance L is shorter with the semiconductor device 1 of the first example embodiment than it is with the structure of the assumed technology. That is, the structure of the semiconductor device 1 of the first example embodiment increases the packaging density of the semiconductor elements 2, which also enables the size of the overall device to be smaller.

Next, a second example embodiment of the invention will be described. In the semiconductor device 1 of the first example embodiment described above, the relationship between the height of the protruding portion 3a and the height (i.e., the depth) of the recessed portion 3b in the front-back direction, and relationship between the height of the protruding portion 4a and the height (i.e., the depth) of the recessed portion 4b are not particularly limited, but in the second example embodiment, these relationships are defined.

Figure 6:
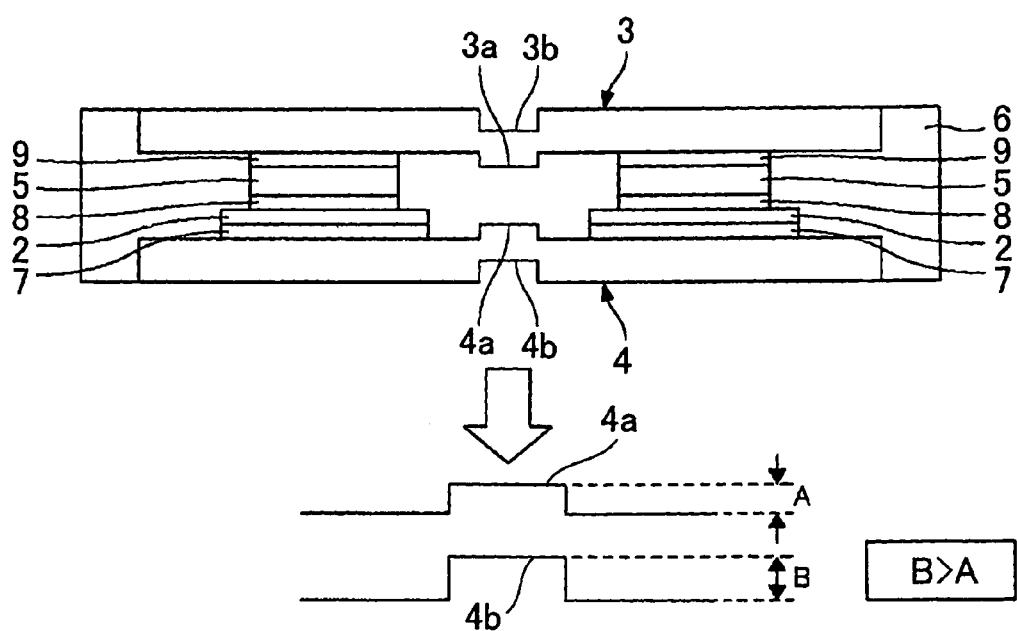
FIG. 6 is a view showing a frame format of modes of protruding portions and recessed portions of a semiconductor device according to a second example embodiment of the invention, at a cross section that includes semiconductor elements.

As shown in FIG. 6, in the semiconductor device 1 according to the second example embodiment, the height A of the protruding portion 4a of the heat spreader 4 is less than the height B of the recessed portion 4b. Although not shown in FIG. 6, the height of the protruding portion 3a is also less than the height of the recessed portion 3b. A shape that satisfies these relationships may be formed by pressing the base material of the heat spreader 3 and the heat spreader 4 using a die. In this case, material that is able to easily be pressed out to the side with respect to the pressing direction of the die is selected for the base material.

As described in the first example embodiment, when collecting the primer 10 between the semiconductor elements 2 using the protruding portions 3a and 4a, the primer 10 only needs to be able to be sucked toward the protruding portions that serve as obstacles positioned on a flat plate by the surface tension of the primer 10, and this function of collecting the primer 10 is able to be ensured even if the protruding portions are smaller than the recessed portions. According to this second example embodiment, the height of the protruding portions may be as low as possible in order to ensure this function.

Also, with the rigidity inhibited from increasing by the protruding portions, and the recessed portions being as large as possible by satisfying this relationship, the rigidity of the heat spreader 3 and the heat spreader 4 at the portion positioned between the two semiconductor elements 2 can be further decreased, so the ability to follow the shrinkage of the resin during curing is increased, and as a result, the peeling inhibiting effect is able to be increased.

In the first and second example embodiment described above, the shapes of the recessed portions are long rectangular shapes when viewed from a perpendicular direction that is perpendicular to the direction in which the two semiconductor elements 2 are arranged in a line. The shapes of the protruding portions are also based on the shapes of the recessed portions, but these shapes may be changed as appropriate depending on how much the rigidity of the heat spreader 3 and the heat spreader 4 is decreased and how much primer 10 is collected to match the expected area of peeling shown in FIG. 4D in the assumed structure, or depending on the situation such as convenience in press forming. Hereinafter, another example embodiment will be described.

Figure 7A:
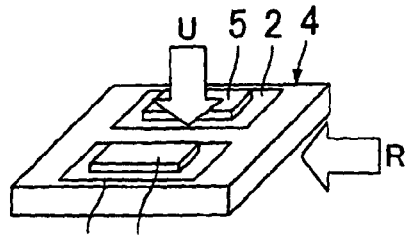
FIG. 7A is a view showing a frame format, in a front view and a right side view, of a back surface-side heatsink on which semiconductor elements are arranged in a semiconductor device according to a third example embodiment of the invention.
Figure 7B:
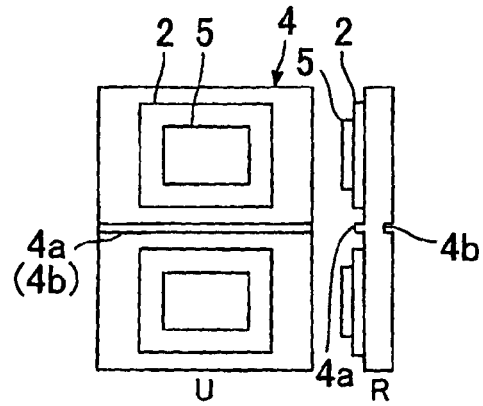
FIG. 7B is a view showing a frame format of the semiconductor device according to the third example embodiment of the invention when a protruding portion and a recessed portion have long rectangular shapes.
Figure 7C:
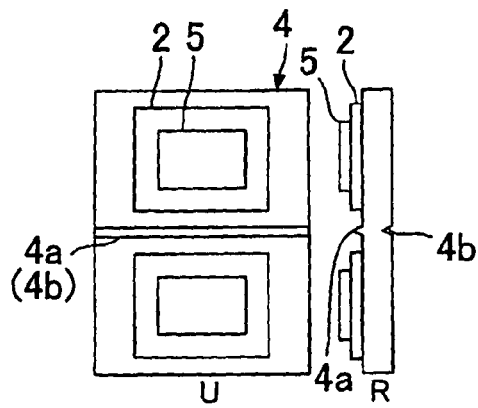
FIG. 7C is a view showing a frame format of the semiconductor device according to the third example embodiment of the invention when the protruding portions and recessed portions have triangular shapes.

FIG. 7A is a view of the semiconductor device 1 illustrated by another example embodiment of the invention described below, and shows a right side view R and a plan view U when viewed from the front surface of the heat spreader 4 on which the two semiconductor elements 2 are mounted. The protruding portion 4a and the recessed portion 4b may also have long rectangular shapes, as shown in FIG. 7B. The protruding portion 4a and the recessed portion 4b may both also have a triangular shape, as shown in FIG. 7C.

Figure 7D:
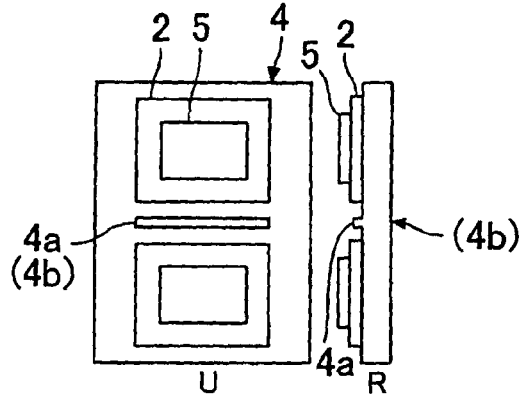
FIG. 7D is a view showing a frame format of the semiconductor device according to the third example embodiment of the invention when end portions of the protruding portions are aligned with end portions of the semiconductor elements.
Figure 7E:
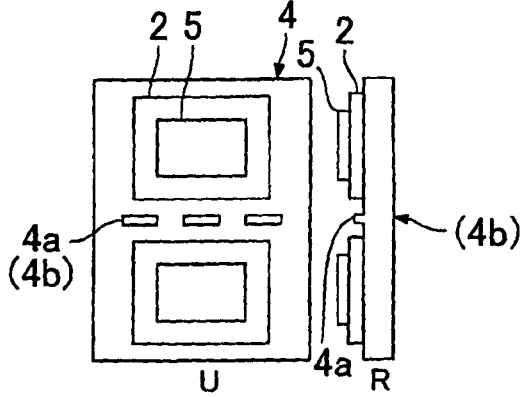
FIG. 7E is a view showing a frame format of the semiconductor device according to the third example embodiment of the invention when the protruding portions are provided intermittently.

The end portions of the protruding portion 4a and the recessed portion 4b may also be aligned each other with each of the end portions in the perpendicular direction of the semiconductor elements 2, as shown in FIG. 7D. Furthermore, instead of providing the protruding portion 4a and the recessed portion 4b continuously from the start edges to the end edges, they may also be provided intermittently, as shown in FIG. 7E.

That is, the edges in the perpendicular direction of the protruding portion 4a and the recessed portion 4b are located in the regions where the two semiconductor elements 2 exist laterally in the perpendicular direction. In the mode shown in FIG. 7E, the total length of the protruding portion 4a and the recessed portion 4b in the perpendicular direction is the same as it is in the mode shown in FIG. 7D, so the ends in the perpendicular direction of the protruding portion 4a and the recessed portion 4b protrude in the perpendicular direction with respect to the semiconductor elements 2.

Figure 7F:
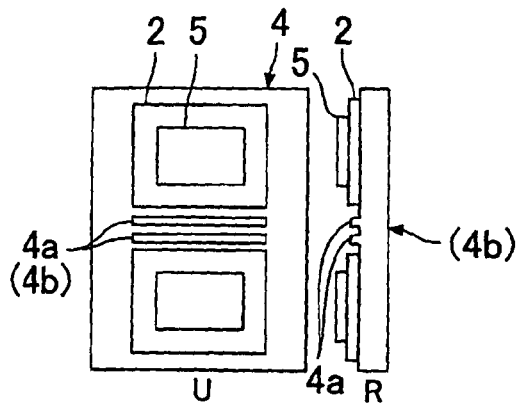
FIG. 7F is a view showing a frame format of the semiconductor device according to the third example embodiment of the invention when a plurality of the protruding portions are provided.
Figure 7G:
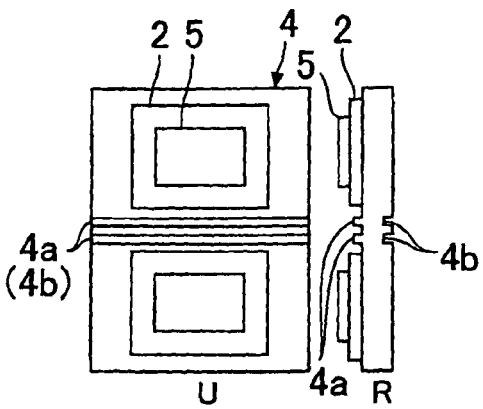
FIG. 7G is a view showing a frame format of the semiconductor device according to the third example embodiment of the invention when a plurality of the protruding portions and recessed portions are provided, and start edges and end edges are aligned with end portions of a heat spreader.

The protruding portion 4a and the recessed portion 4b may each be a single portion as described above, or they may each be formed by a plurality of portions that are lined up, as shown in FIG. 7F. Also, the ends in the perpendicular direction may be aligned with the end portions of the heat spreader 4, as shown in FIG. 7G. The above description with reference to FIGS. 7A to 7D also applies to the protruding portion 3a and the recessed portion 3b of the heat spreader 3.

In the example embodiments described above, providing the protruding portion on the side that faces the sealing member 6 makes it possible to appropriately ensure the film thickness of the primer applied before sealing the heat spreaders with resin across the entire region to which the primer is to be applied. As a result, the joining ability of the heat spreaders and the sealing member 6 is improved, which enables peeling to be inhibited.

Also in the example embodiment described above, providing the recessed portions 3b and 4b on the heat spreaders 3 and 4, respectively, enables the heat spreaders 3 and 4 to deform following stress generated in a direction away from the heat spreaders 3 and 4 when the sealing member 6 thermally shrinks. As a result, peeling between the sealing member and the heat spreaders 3 and 4 is able to be, inhibited.

In the example embodiments described above, both the front surface-side heatsink and the back surface-side heatsink are provided with a protruding portion. However, if it is possible to inhibit peeling by ensuring film thickness of the primer on only one side, only one may be provided with a protruding portion. Also, in the example embodiments described above, the protruding portions are formed by providing recessed portions on the back side from the viewpoint of ease of manufacturing, but the invention is not limited to this. For example, as shown in FIGS. 7D, 7E, and 7F, the recessed portion 4b may be omitted and only the protruding portion 4a may be provided. In this case as well, the structure may also be formed by a method that involves press forming a heatsink from the side on which the protruding portion 4a is provided.

While various example embodiments of the invention have been described, the invention is not intended to be limited to these example embodiments. That is, various modifications and substitutions may be made to the example embodiments described above without departing from the scope of the invention.

The invention relates to a double-sided cooling type semiconductor device provided a heat spreader on both a front surface and a back surface, and may be applied to a mode in which two or more semiconductor elements are arranged in a line.

The invention is able to inhibit peeling inside of a semiconductor device, and is thus beneficial applied to a variety of types of semiconductor-related devices having the characteristics described above. Naturally, the invention is also beneficial applied to a semiconductor module that is applied to an inverter and the like of a variety of vehicles such as passenger vehicles, trucks, and buses.

The invention claimed is:

1. A semiconductor device comprising:
   a plurality of semiconductor elements each having a front surface and a back surface;
   a front surface-side heatsink that is positioned on a front surface side of the semiconductor elements and dissipates heat generated by the semiconductor elements;
   a back surface-side heatsink that is positioned on a back surface side of the semiconductor elements and dissipates heat generated by the semiconductor elements;
   a sealing member that covers the semiconductor device except for a front surface of the front surface-side heatsink and a back surface of the back surface-side heatsink;
   a primer that is coated on at least one of the front surface-side heatsink and the back surface-side heatsink and improves contact with the sealing member;
   a protruding portion positioned between the plurality of semiconductor elements, on at least one of the back surface of the front surface-side heatsink and the front surface of the back surface-side heatsink; and
   a recessed portion provided in a position corresponding to the protruding portion, on at least one of the front surface of the front surface-side heatsink and the back surface of the back surface-side heatsink, wherein a height of the protruding portion is lower than a height of the recessed portion.

2. The semiconductor device according to claim 1, wherein the protruding portion extends in a perpendicular direction that is perpendicular to an arranging direction in which the plurality of semiconductor elements are arranged.

3. The semiconductor device according to claim 2, wherein the protruding portion extends intermittently in the perpendicular direction.

4. The semiconductor device according to claim 2, wherein the protruding portion exists in plurality in the perpendicular direction.

5. The semiconductor device according to claim 2, wherein an end in the perpendicular direction of the protruding portion is aligned with end portion of at least one of the front surface-side heatsink and the back surface-side heatsink.

6. The semiconductor device according to claim 2, wherein an end in the perpendicular direction of the protruding portion is located in a region where the semiconductor elements exist laterally in the perpendicular direction.

* * * * *